United States Patent
Khlat (10) Patent No.: US 10,992,264 B2
(45) Date of Patent: Apr. 27, 2021

(54) ENVELOPE TRACKING CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 95 days.

(21) Appl. No.: 16/508,704

(22) Filed: Jul. 11, 2019

(65) Prior Publication Data
US 2020/0295708 A1    Sep. 17, 2020

Related U.S. Application Data

(60) Provisional application No. 62/817,824, filed on Mar. 13, 2019.

(51) Int. Cl.
*H03F 1/30* (2006.01)
*H03F 1/02* (2006.01)
*H03F 3/60* (2006.01)

(52) U.S. Cl.
CPC .............. *H03F 1/02* (2013.01); *H03F 3/602* (2013.01); *H03F 3/605* (2013.01); *H03F 2200/102* (2013.01); *H03F 2200/451* (2013.01)

(58) Field of Classification Search
CPC ...................................................... H03F 1/30
USPC ................................................ 330/297, 296
See application file for complete search history.

(56) References Cited

U.S. PATENT DOCUMENTS

| | | | |
|---|---|---|---|
| 6,529,716 B1 | 3/2003 | Eidson et al. |
| 6,788,151 B2 | 9/2004 | Shvarts et al. |
| 8,019,289 B2 | 9/2011 | Gorbachov |
| 8,290,453 B2 | 10/2012 | Yoshihara |
| 8,385,859 B2 | 2/2013 | Hamano |
| 8,476,976 B2 | 7/2013 | Wimpenny |
| 8,598,950 B2 | 12/2013 | Khesbak |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |

(Continued)

OTHER PUBLICATIONS

Notice of Allowance for U.S. Appl. No. 16/193,513, dated Mar. 25, 2020, 8 pages.

(Continued)

*Primary Examiner* — Henry Choe
(74) *Attorney, Agent, or Firm* — Withrow & Terranova, P.L.L.C.

(57) ABSTRACT

An envelope tracking (ET) circuit is provided. In examples discussed herein, the ET circuit can be configured to operate in a fifth-generation (5G) standalone (SA) mode and a 5G non-standalone (NSA) mode. In the SA mode, the ET circuit can enable a first pair of ET power amplifier circuits to amplify a 5G signal based on ET for concurrent transmission in a 5G band(s). In the NSA mode, the ET circuit can enable a second pair of ET power amplifier circuits to amplify an anchor signal and a 5G signal based on ET for concurrent transmission in an anchor band(s) and a 5G band(s), respectively. As such, the ET circuit may be provided in a 5G-enabled wireless communication device (e.g., a 5G-enabled smartphone) to help improve power amplifier linearity and efficiency in both 5G SA and NSA networks.

20 Claims, 3 Drawing Sheets

(56) References Cited

U.S. PATENT DOCUMENTS

| | | |
|---|---|---|
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,270,230 B2 | 2/2016 | Henshaw et al. |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 | 8/2014 | Wimpenny |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094185 A1 | 3/2016 | Shute |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |
| 2020/0350878 A1* | 11/2020 | Drogi .................. H04W 52/52 |

OTHER PUBLICATIONS

Non-Final Office Action for U.S. Appl. No. 16/250,229, dated Apr. 29, 2020, 7 pages.

Non-Final Office Action for U.S. Appl. No. 16/267,740, dated Apr. 30, 2020, 10 pages.

Final Office Action for U.S. Appl. No. 16/263,316, dated May 13, 2020, 10 pages.

Notice of Allowance for U.S. Appl. No. 16/270,119, dated Jun. 18, 2020, 9 pages.

Non-Final Office Action for U.S. Appl. No. 16/278,886, dated Apr. 29, 2020, 9 pages.

Quayle Action for U.S. Appl. No. 16/267,779, dated May 1, 2020, 8 pages.

Final Office Action for U.S. Appl. No. 16/263,368, dated May 22, 2020, 9 pages.

U.S. Appl. No. 16/193,513, filed Nov. 16, 2018.
U.S. Appl. No. 16/250,229, filed Jan. 17, 2019.
U.S. Appl. No. 16/267,740, filed Feb. 5, 2019.
U.S. Appl. No. 16/263,316, filed Jan. 31, 2019.
U.S. Appl. No. 16/270,119, filed Feb. 7, 2019.
U.S. Appl. No. 16/273,288, filed Feb. 12, 2019.
U.S. Appl. No. 16/278,886, filed Feb. 19, 2019.
U.S. Appl. No. 16/250,298, filed Jan. 17, 2019.
U.S. Appl. No. 16/267,779, filed Feb. 5, 2019.

(56) References Cited

OTHER PUBLICATIONS

U.S. Appl. No. 16/263,368, filed Jan. 31, 2019.
U.S. Appl. No. 16/508,768, filed Jul. 11, 2019.
U.S. Appl. No. 16/514,339, filed Jul. 17, 2019.
Notice of Allowance for U.S. Appl. No. 16/250,229, dated Sep. 22, 2020, 7 pages.
Non-Final Office Action for U.S. Appl. No. 16/263,316, dated Jul. 17, 2020, 4 pages.
Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
U.S. Appl. No. 16/689,236, filed Nov. 20, 2019.
Non-Final Office Action for U.S. Appl. No. 16/263,368, dated Dec. 26, 2019, 6 pages.
Notice of Allowance for U.S. Appl. No. 16/273,288, dated Dec. 13, 2019, 8 pages.
Non-Final Office Action for U.S. Appl. No. 16/263,316, dated Dec. 23, 2019, 9 pages.
Quayle Action for U.S. Appl. No. 16/267,740, dated Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,768, dated Oct. 27, 2020, 9 pages.
Quayle Action for U.S. Appl. No. 16/514,339, dated Nov. 19, 2020, 9 pages.
Notice of Allowance for U.S. Appl. No. 16/267,740, dated Mar. 3, 2021, 8 pages.
Quayle Action for U.S. Appl. No. 16/250,298, dated Feb. 3, 2021, 5 pages.
Non-Final Office Action for U.S. Appl. No. 16/689,236, dated Mar. 2, 2021, 15 pages.
Non-Final Office Action for U.S. Appl. No. 16/660,900, dated Feb. 18, 2021, 7 pages.
Notice of Allowance for U.S. Appl. No. 16/689,417, dated Feb. 24, 2021, 7 pages.

\* cited by examiner

ENVELOPE TRACKING CIRCUIT AND RELATED APPARATUS

RELATED APPLICATIONS

This application claims the benefit of U.S. provisional patent application Ser. No. 62/817,824, filed on Mar. 13, 2019, which is incorporated herein by reference in its entirety.

FIELD OF THE DISCLOSURE

The technology of the disclosure relates generally to an envelope tracking (ET) power amplifier circuit/apparatus.

BACKGROUND

Fifth-generation (5G) new radio (NR) (5G-NR) has been widely regarded as the new generation of wireless communication technology beyond the current third-generation (3G) communication technology, such as wideband code division multiple access (WCDMA), and fourth-generation (4G) communication technology, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards.

Notably, a 5G-NR wireless communication system may be deployed as a non-standalone (NSA) system or a standalone (SA) system. In an NSA system, a 5G-enabled wireless communication device (e.g., a smartphone) is configured to transmit and/or receive control information and data payloads in an anchor band (e.g., a 4G frequency band) and a 5G frequency band, respectively. In contrast, in a SA system, the 5G-enabled wireless communication device will communicate both control information and data payloads exclusively in the 5G frequency band.

Further, to achieve the higher data rate in the 5G-enabled wireless communication device, sophisticated power amplifiers (PAs) may be employed to increase output power of a 5G RF signal(s) communicated by the 5G-enabled wireless communication device. However, the increased output power of 5G RF signal(s) can lead to increased power consumption and thermal dissipation, thus compromising overall performance and user experiences. Envelope tracking (ET) is a power management technology designed to improve efficiency levels of PAs to help reduce power consumption and thermal dissipation in the 5G-enabled wireless communication device. In this regard, it may be desired to ensure that the 5G-enabled wireless communication device can enable ET power management in both the NSA system and the SA system.

SUMMARY

Embodiments of the disclosure relate to an envelope tracking (ET) circuit. In examples discussed herein, the ET circuit can be configured to operate in a fifth-generation (5G) standalone (SA) mode and a 5G non-standalone (NSA) mode. In the SA mode, the ET circuit can enable a first pair of ET power amplifier circuits to amplify a 5G signal based on ET for concurrent transmission in a 5G band(s). In the NSA mode, the ET circuit can enable a second pair of ET power amplifier circuits to amplify an anchor signal and a 5G signal based on ET for concurrent transmission in an anchor band(s) and a 5G band(s), respectively. As such, the ET circuit may be provided in a 5G-enabled wireless communication device (e.g., a 5G-enabled smartphone) to help improve power amplifier linearity and efficiency in both 5G SA and NSA networks.

In one aspect, an ET circuit is provided. The ET circuit includes at least one first port coupled to at least one first power amplifier circuit configured to amplify a 5G signal for transmission in at least one 5G band. The ET circuit also includes at least one second port coupled to at least one second power amplifier circuit configured to amplify an anchor signal for transmission in at least one anchor band. The ET circuit also includes at least one third port coupled to at least one distributed power amplifier (DPA) circuit configured to amplify the 5G signal for transmission in the at least one 5G band. The ET circuit also includes a control circuit. The control circuit is configured to cause an ET voltage to be provided to a selected port among the at least one first port and the at least one second port for amplifying a selected signal among the 5G signal and the anchor signal. The control circuit is also configured to cause a non-ET current to be provided to the at least one third port for amplifying the 5G signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) circuit. In examples discussed herein, the ET circuit can be configured to operate in a fifth-generation (5G) standalone (SA) mode and a 5G non-standalone (NSA) mode. In the SA mode, the ET circuit can enable a first pair of ET power amplifier circuits to amplifier a 5G signal based on ET for concurrent transmission in a 5G band(s). In the NSA mode, the ET circuit can enable a second pair of ET power amplifier circuits to amplify an anchor signal and a 5G signal based on ET for concurrent transmission in an anchor band(s) and a 5G band(s), respectively. As such, the ET circuit may be provided in a 5G-enabled wireless communication device (e.g., a 5G-enabled smartphone) to help improve power amplifier linearity and efficiency in both 5G SA and NSA networks.

Figure 1:
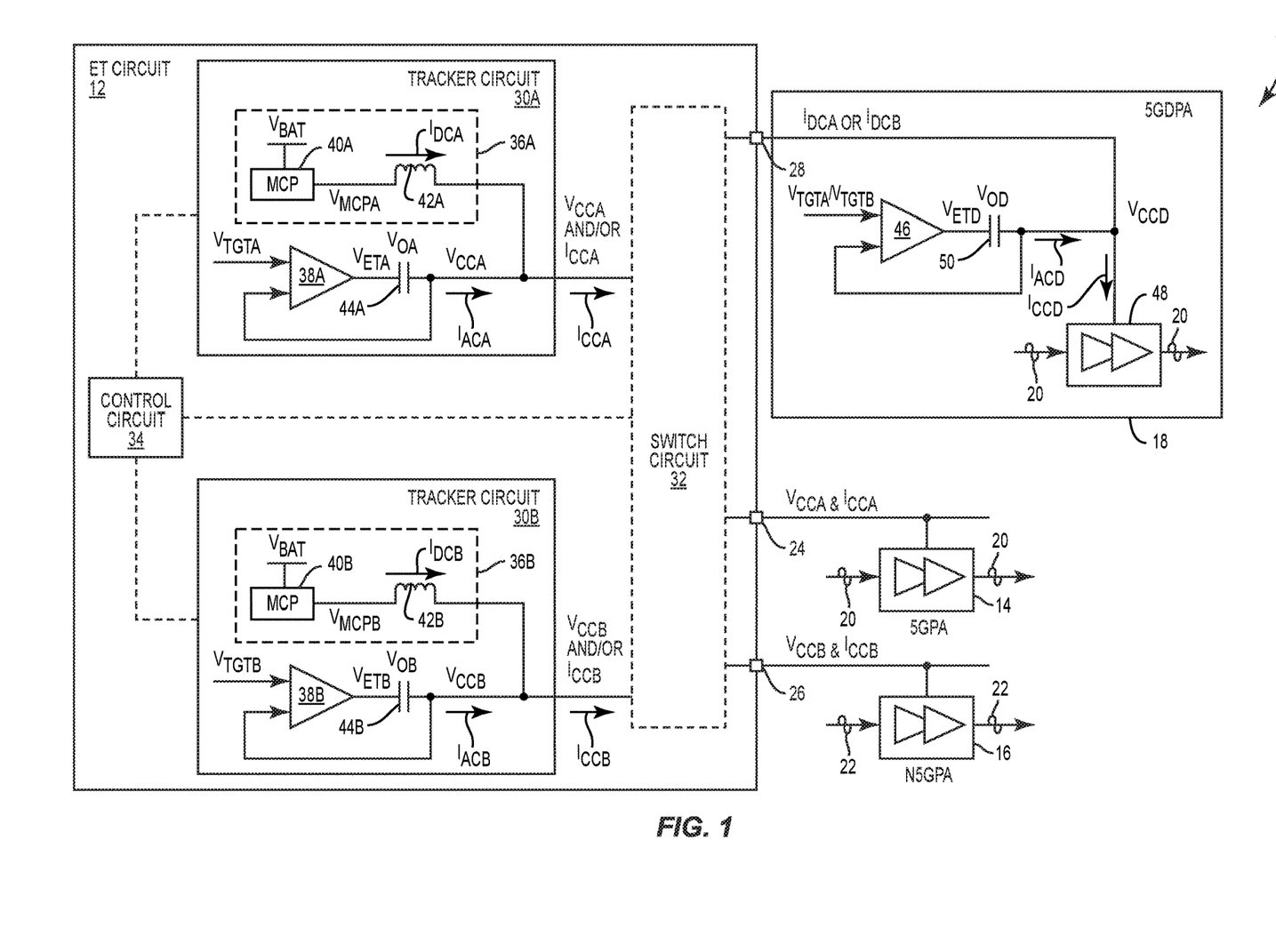
FIG. 1 is a schematic diagram of an exemplary envelope tracking (ET) amplifier apparatus configured according to an embodiment of the present disclosure to operate in both fifth-generation (5G) standalone (SA) and non-standalone (NSA) modes.

In this regard, FIG. 1 is a schematic diagram of an exemplary ET amplifier apparatus 10 configured according to an embodiment of the present disclosure to operate in both 5G SA and NSA modes. The ET amplifier apparatus 10 includes an ET circuit 12, at least one first power amplifier circuit 14 (denoted as "5GPA"), at least one second power amplifier circuit 16 (denoted as "N5GPA"), and at least one distributed power amplifier (DPA) circuit 18 (denoted as "5GDPA").

In a non-limiting example, the first power amplifier circuit 14 and the DPA circuit 18 are 5G power amplifier circuits. In this regard, the first power amplifier circuit 14 and the DPA circuit 18 can be configured to amplify a 5G signal 20 for transmission in at least one 5G band, such as 5G band n41 (2496-2690 MHz), 5G band n77 (3300-4200 MHz), and 5G band n79 (4400-5000 MHz), for example. In examples discussed herein, the first power amplifier circuit 14 and the DPA circuit 18 are configured to amplify the 5G signal 20 for concurrent transmission in the 5G band when the ET amplifier apparatus operates in the SA mode. In this regard, the ET amplifier apparatus 10 may be configured to support 5G uplink multiple-input multiple-output (MIMO) in the SA mode. Notably, the ET amplifier apparatus 10 can include additional power amplifier circuits and/or DPA circuits for amplifying the 5G signal 20 in additional 5G bands.

In another non-limiting example, the second power amplifier circuit 16 is a non-5G power amplifier circuit. The second power amplifier circuit 16 may be configured to amplify an anchor signal 22 for transmission in at least one anchor band, such as a fourth-generation (4G) long-term evolution (LTE) band. In examples discussed herein, the second power amplifier circuit 16 and the DPA circuit 18 are configured to amplify the anchor signal 22 and the 5G signal 20 for concurrent transmission in the anchor band and the 5G band, respectively, when the ET amplifier apparatus operates in the NSA mode. In this regard, the anchor signal 22 may carry 5G control information and the 5G signal 20 may carry 5G data payloads in the NSA mode. Notably, the ET amplifier apparatus 10 can include additional non-5G power amplifier circuits, such as second-generation (2G) and/or third-generation (3G) power amplifier circuits for amplifying 2G and/or 3G signals. As such, the ET amplifier apparatus 10 can be backward compatible with legacy 2G and 3G networks.

The ET circuit 12 includes at least one first port 24, at least one second port 26, and at least one third port 28 configured to be coupled to the first power amplifier circuit 14, the second power amplifier circuit 16, and the DPA circuit 18, respectively. The ET circuit 12 can include a first tracker circuit 30A and a second tracker circuit 30B configured to generate a first ET voltage $V_{CCA}$ and a second ET voltage $V_{CCB}$, respectively. In a non-limiting example, the ET circuit 12 can include a switch circuit 32 coupled to the first tracker circuit 30A, the second tracker circuit 30B, the first port 24, the second port 26, and the third port 28. The ET circuit 12 also includes a control circuit 34 coupled to the first tracker circuit 30A, the second tracker circuit 30B, and the switch circuit 32.

In this regard, the control circuit 34 can be configured to selectively couple the first tracker circuit 30A and/or the second tracker circuit 30B to the first port 24, the second port 26, and/or the third port 28 in the SA mode and the NSA mode. As discussed in detail below, the control circuit 34 may control the first tracker circuit 30A, the second tracker circuit 30B, and the switch circuit 32 to cause an ET voltage (e.g., the first ET voltage $V_{CCA}$ or the second ET voltage $C_{CCB}$) to be selectively provided to a selected port among the first port 24 and the second port 26. More specifically, the control circuit 34 may control the first tracker circuit 30A, the second tracker circuit 30B, and the switch circuit 32 to cause the ET voltage to be provided to the first port 24 and the second port 26 in the SA mode and the NSA mode, respectively. In addition, the control circuit 34 may control the first tracker circuit 30A, the second tracker circuit 30B, and the switch circuit 32 to cause a non-ET current (e.g., a direct current) to be provided to the third port 28 in both the SA mode and the NSA mode.

The first tracker circuit 30A includes a first charge pump circuit 36A and a first voltage amplifier 38A. The first charge pump circuit 36A includes a first multi-level charge pump (MCP) 40A and a first inductor 42A. The first MCP 40A is configured to generate a first constant voltage $V_{MCPA}$ at multiple levels based on a battery voltage $V_{BAT}$. In a non-limiting example, the first constant voltage $V_{MCPA}$ can be equal to zero-time of the battery voltage $V_{BAT}$ ($0 \times V_{BAT}$), one-time of the battery voltage $V_{BAT}$ ($1 \times V_{BAT}$), or two-times of the battery voltage $V_{BAT}$ ($2 \times V_{BAT}$). The first constant voltage $V_{MCPA}$ may cause the first inductor 42A to induce a first direct current (DC) $I_{DCA}$.

The first voltage amplifier 38A is configured to generate a first ET modulated voltage $V_{ETA}$ based on a first ET target voltage $V_{TGTA}$. The first voltage amplifier 38A may be coupled to a first offset capacitor 44A, which is configured to raise the first ET modulated voltage $V_{ETA}$ by a first offset voltage $V_{OA}$ (e.g., 0.8 V) to generate the first ET voltage $V_{CCA}$ ($V_{CCA}=V_{ETA}+V_{OA}$). Notably, the first ET target voltage $V_{TGTA}$ may correspond to a first time-variant target voltage envelope (not shown) that tracks (rises and falls) a time-variant power envelope (not shown) of the 5G signal 20 or a time-variant power envelope (not shown) of the anchor signal 22. Accordingly, the first voltage amplifier 38A is configured to generate the first ET voltage $V_{CCA}$ that rises and falls according to the first time-variant target voltage envelope of the first ET target voltage $V_{TGTA}$ and thus the time-variant power envelope of the 5G signal 20 or the time-variant power envelope of the anchor signal 22.

The first voltage amplifier 38A may also source a first alternating current (AC) $I_{ACA}$ that tracks the time-variant power envelope of the 5G signal 20 or the time-variant power envelope of the anchor signal 22. As such, the first AC $I_{ACA}$ can be referred to as an ET current. In contrast, the first DC $I_{DCA}$ is configured to be relatively constant and thus does not rise and fall in accordance to the time-variant power envelope of the 5G signal 20. As such, the first DC $I_{DCA}$ can be referred to as a non-ET current. In this regard, the first tracker circuit 30A can be configured to generate a first ET current $I_{CCA}$ that includes the ET current $I_{ACA}$ and the non-ET current $I_{DCA}$ ($I_{CCA}=I_{ACA}+I_{DCA}$).

The second tracker circuit 30B includes a second charge pump circuit 36B and a second voltage amplifier 38B. The second charge pump circuit 36B includes a second MCP 40B and a second inductor 42B. The second MCP 40B is configured to generate a second constant voltage $V_{MCPB}$ at multiple levels based on the battery voltage $V_{BAT}$. In a non-limiting example, the second constant voltage $V_{MCPB}$ can be equal to $0 \times V_{BAT}$, $1 \times V_{BAT}$, or $2 \times V_{BAT}$. The second constant voltage $V_{MCPB}$ may cause the second inductor 42B to induce a second DC $I_{DCB}$.

The second voltage amplifier 38B is configured to generate a second ET modulated voltage $V_{ETB}$ based on a second ET target voltage $V_{TGTB}$. The second voltage amplifier 38B may be coupled to a second offset capacitor 44B, which is configured to raise the second ET modulated voltage $V_{ETB}$ by a second offset voltage $V_{OB}$ (e.g., 0.8 V) to generate the second ET voltage $V_{CCB}$ ($V_{CCB}=V_{ETB}+V_{OB}$). Notably, the second ET target voltage $V_{TGTB}$ may correspond to a second time-variant target voltage envelope (not shown) that tracks (rises and falls) the time-variant power envelope of the 5G signal 20 or the time-variant power envelope of the anchor signal 22. Accordingly, the second voltage amplifier 38B is configured to generate the second ET voltage $V_{CCB}$ that rises and falls according to the second time-variant target voltage envelope of the second ET target voltage $V_{TGTB}$ and thus the time-variant power envelope of the 5G signal 20 or the time-variant power envelope of the anchor signal 22.

The second voltage amplifier 38B may also source a second AC $I_{ACB}$ that tracks the time-variant power envelope of the 5G signal 20 or the time-variant power envelope of the anchor signal 22. As such, the second AC $I_{ACB}$ can be referred to as an ET current. In contrast, the second DC $I_{DCB}$ is configured to be relatively constant and thus does not rise and fall in accordance to the time-variant power envelope of the anchor signal 22. As such, the second DC $I_{DCB}$ can be referred to as a non-ET current. In this regard, the second tracker circuit 30B can be configured to generate a second ET current $I_{CCB}$ that includes the ET current $I_{ACB}$ and the non-ET current $I_{DCB}$ ($I_{CCB}=I_{ACB}+I_{DCB}$).

The DPA circuit 18 can be configured to include a distributed voltage amplifier 46 and a distributed power amplifier circuit 48. In a non-limiting example, the distributed voltage amplifier 46 is configured to generate a distributed ET modulated voltage $V_{ETD}$ based on the first ET target voltage $V_{TGTA}$ or the second ET target voltage $V_{TGTB}$, depending on which of the first ET target voltage $V_{TGTA}$ and the second ET target voltage $V_{TGTB}$ is configured to track the time-variant power envelope of the 5G signal 20. The distributed voltage amplifier 46 may be coupled to a distributed offset capacitor 50, which is configured to raise the distributed ET modulated voltage $V_{ETD}$ by an offset voltage $V_{OD}$ (e.g., 0.8 V) to generate a distributed ET voltage $V_{CCD}$ ($V_{CCD}=V_{ETD}+V_{OD}$) that tracks the time-variant power envelope of the 5G signal 20.

The distributed voltage amplifier 46 may also source a distributed AC $I_{ACD}$ that tracks the time-variant power envelope of the 5G signal 20. As such, the distributed AC $I_{ACD}$ can be referred to as an ET current. The DPA 18 is configured to receive either the first DC $I_{DCA}$ or the second DC $I_{DCB}$ as the non-ET current. Accordingly, the distributed power amplifier circuit 48 receives a distributed ET current $I_{CCD}$ that includes the distributed AC $I_{ACD}$ and one of the first DC $I_{DCA}$ and the second DC $I_{DCB}$ ($I_{CCD}=I_{ACD}+I_{DCA}/I_{DCB}$). Accordingly, the distributed power amplifier circuit 48 can amplify the 5G signal 20 based on the distributed ET voltage $V_{CCD}$ and the distributed ET current $I_{CCD}$. Given that the DPA circuit 18 only receives the first DC $I_{DCA}$ or the second DC $I_{DCB}$ from the ET circuit 12, it may be possible for the DPA circuit 18 and the ET circuit 12 to be coupled by a longer conductive trace without being concerned about trace inductance associated with the conductive trace.

In one non-limiting example, in the SA mode, the control circuit 34 can be configured to couple the first voltage amplifier 38A and the first charge pump circuit 36A to the first port 24 to provide the first ET voltage $V_{CCA}$ and the first ET current $I_{CCA}$ to the first power amplifier circuit 14. Accordingly, the first power amplifier circuit 14 can amplify the 5G signal 20 based on the first ET voltage $V_{CCA}$ and the first ET current $I_{CCA}$. In this regard, the first ET target voltage $V_{TGTA}$ is configured to track the time-variant power envelope of the 5G signal 20. Therefore, the distributed voltage amplifier 46 in the DPA circuit 18 will be configured to generate the distributed voltage $V_{CCD}$ based on the first ET target voltage $V_{CCA}$. Concurrently, the control circuit 34 may couple the second charge pump circuit 36B to the third port 28 to provide the second DC $I_{DCB}$ to the DPA circuit 18. Given that the DPA circuit 18 is capable of generating the distributed ET voltage $V_{CCD}$, the control circuit 34 may deactivate the second voltage amplifier 38B in the second tracker circuit 30B. The control circuit 34 may be further configured to decouple the second port 26 from the second charge pump circuit 46B such that an inherent impedance of the second power amplifier circuit 16 can be removed.

In another non-limiting example, in the SA mode, the control circuit 34 can be configured to couple the second voltage amplifier 38B and the second charge pump circuit 36B to the first port 24 to provide the second ET voltage $V_{CCB}$ and the second ET current $I_{CCB}$ to the first power amplifier circuit 14. Accordingly, the first power amplifier circuit 14 can amplify the 5G signal 20 based on the second ET voltage $V_{CCB}$ and the second ET current $I_{CCB}$. In this regard, the second ET target voltage $V_{TGTB}$ is configured to track the time-variant power envelope of the 5G signal 20. Therefore, the distributed voltage amplifier 46 in the DPA circuit 18 will be configured to generate the distributed voltage $V_{CCD}$ based on the second ET target voltage $V_{CCB}$. Concurrently, the control circuit 34 may couple the first charge pump circuit 36A to the third port 28 to provide the first DC $I_{DCA}$ to the DPA circuit 18. Given that the DPA circuit 18 is capable of generating the distributed ET voltage $V_{CCD}$, the control circuit 34 may deactivate the first voltage amplifier 38A in the first tracker circuit 30A. The control circuit 34 may be further configured to decouple the second port 26 from the first charge pump circuit 46A such that an inherent impedance of the second power amplifier circuit 16 can be removed.

In another non-limiting example, in the NSA mode, the control circuit 34 can be configured to couple the first voltage amplifier 38A and the first charge pump circuit 36A to the second port 26 to provide the first ET voltage $V_{CCA}$ and the first ET current $I_{CCA}$ to the second power amplifier circuit 16. Accordingly, the second power amplifier circuit 16 can amplify the anchor signal 22 based on the first ET voltage $V_{CCA}$ and the first ET current $I_{CCA}$. In this regard, the first ET target voltage $V_{TGTA}$ is configured to track the time-variant power envelope of the anchor signal 22. Therefore, the distributed voltage amplifier 46 in the DPA circuit 18 will be configured to generate the distributed voltage $V_{CCD}$ based on the second ET target voltage $V_{CCB}$. Concurrently, the control circuit 34 may couple the second charge pump circuit 36B to the third port 28 to provide the second DC $I_{DCB}$ to the DPA circuit 18. Given that the DPA circuit 18 is capable of generating the distributed ET voltage $V_{CCD}$, the control circuit 34 may deactivate the second voltage amplifier 38B in the second tracker circuit 30B. The control circuit 34 may be further configured to decouple the first port 24 from the second charge pump circuit 46B such that an inherent impedance of the first power amplifier circuit 14 can be removed.

In another non-limiting example, in the NSA mode, the control circuit 34 can be configured to couple the second voltage amplifier 38B and the second charge pump circuit 36B to the second port 26 to provide the second ET voltage $V_{CCB}$ and the second ET current $I_{CCB}$ to the second power amplifier circuit 16. Accordingly, the second power amplifier circuit 16 can amplify the anchor signal 22 based on the second ET voltage $V_{CCB}$ and the second ET current $I_{CCB}$. In this regard, the second ET target voltage $V_{TGTB}$ is configured to track the time-variant power envelope of the anchor signal 22. Therefore, the distributed voltage amplifier 46 in the DPA circuit 18 will be configured to generate the distributed voltage $V_{CCD}$ based on the first ET target voltage $V_{CCA}$. Concurrently, the control circuit 34 may couple the first charge pump circuit 36A to the third port 28 to provide the first DC $I_{DCA}$ to the DPA circuit 18. Given that the DPA circuit 18 is capable of generating the distributed ET voltage $V_{CCD}$, the control circuit 34 may deactivate the first voltage amplifier 38A in the first tracker circuit 30A. The control circuit 34 may be further configured to decouple the first port 24 from the first charge pump circuit 46A such that an inherent impedance of the first power amplifier circuit 14 can be removed.

Figure 2:
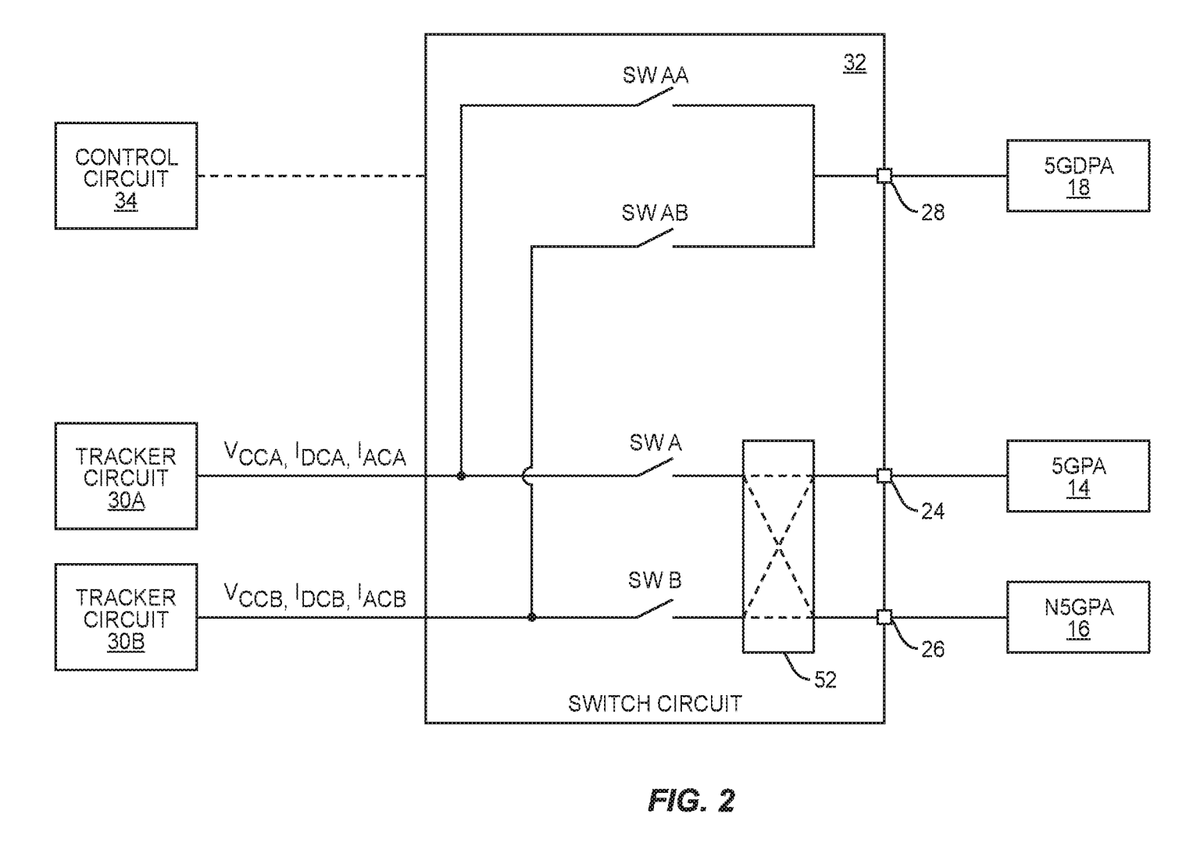
FIG. 2 is a schematic diagram of an exemplary switch circuit that can be provided in the ET circuit of FIG. 1 to enable a dual-mode (SA and NSA) operation.

The control circuit 34 may be configured to selectively couple the first tracker circuit 30A and the second tracker circuit 30B to the first port 24, the second port 26, and the third port 28 via the switch circuit 32. In this regard, FIG. 2 is a schematic diagram providing an exemplary illustration of the switch circuit 32 in the ET circuit 12 of FIG. 1. Common elements between FIGS. 1 and 2 are shown therein with common element numbers and will not be re-described herein.

In a non-limiting example, the switch circuit 32 includes a first switch SWA, a second switch SWB, a first auxiliary switch SWAA, and a second auxiliary switch SWAB. The switch circuit 32 may also include switching circuitry 52, which can be controlled to couple the first switch SWA to any of the first port 24 and the second port 26 or to couple the second switch SWB to any of the first port 24 and the second port 26. The switching circuitry 52 may be configured to include any number and/or type of switches without affecting the above-mentioned functionality of the switching circuitry 52.

In a non-limiting example, in the SA mode, the control circuit 34 may close the first switch SWA to couple the first tracker circuit 30A to the first port 24 to provide the first ET voltage $V_{CCA}$, the first DC $I_{DCA}$, and the first AC $I_{ACA}$ to the first power amplifier circuit 14. Concurrently, the control circuit 34 may open the first auxiliary switch SWAA and close the second auxiliary switch SWAB to couple the second tracker circuit 30B to the third port 28 to provide the second DC $I_{DCB}$ to the DPA circuit 18. In addition, the control circuit 34 may open the second switch SWB to decouple the second port 26 from the first tracker circuit 30A and the second tracker circuit 30B.

In another non-limiting example, in the SA mode, the control circuit 34 may close the second switch SWB to couple the second tracker circuit 30B to the first port 24 to provide the second ET voltage $V_{CCB}$, the second DC $I_{DCB}$, and the second AC $I_{ACB}$ to the first power amplifier circuit 14. Concurrently, the control circuit 34 may close the first auxiliary switch SWAA and open the second auxiliary switch SWAB to couple the first tracker circuit 30A to the third port 28 to provide the first DC $I_{DCA}$ to the DPA circuit 18. In addition, the control circuit 34 may open the second switch SWB to decouple the second port 26 from the first tracker circuit 30A and the second tracker circuit 30B.

In another non-limiting example, in the NSA mode, the control circuit 34 may close the first switch SWA to couple the first tracker circuit 30A to the second port 26 to provide the first ET voltage $V_{CCA}$, the first DC $I_{DCA}$, and the first AC $I_{ACA}$ to the second power amplifier circuit 16. Concurrently, the control circuit 34 may open the first auxiliary switch SWAA and close the second auxiliary switch SWAB to couple the second tracker circuit 30B to the third port 28 to provide the second DC $I_{DCB}$ to the DPA circuit 18. In addition, the control circuit 34 may open the first switch SWA to decouple the first port 24 from the first tracker circuit 30A and the second tracker circuit 30B.

In another non-limiting example, in the NSA mode, the control circuit 34 may close the second switch SWB to couple the second tracker circuit 30B to the second port 26 to provide the second ET voltage $V_{CCB}$, the second DC $I_{DCB}$, and the second AC $I_{ACB}$ to the second power amplifier circuit 16. Concurrently, the control circuit 34 may close the first auxiliary switch SWAA and open the second auxiliary switch SWAB to couple the first tracker circuit 30A to the third port 28 to provide the first DC $I_{DCA}$ to the DPA circuit 18. In addition, the control circuit 34 may open the first switch SWA to decouple the first port 24 from the first tracker circuit 30A and the second tracker circuit 30B.

Notably, the switch circuit 32 as illustrated in FIG. 2 is merely a non-limiting example. It should be appreciated that the switch circuit 32 can be configured based on any number, type, and topology of switches to carry out the above-described functions.

Figure 3:
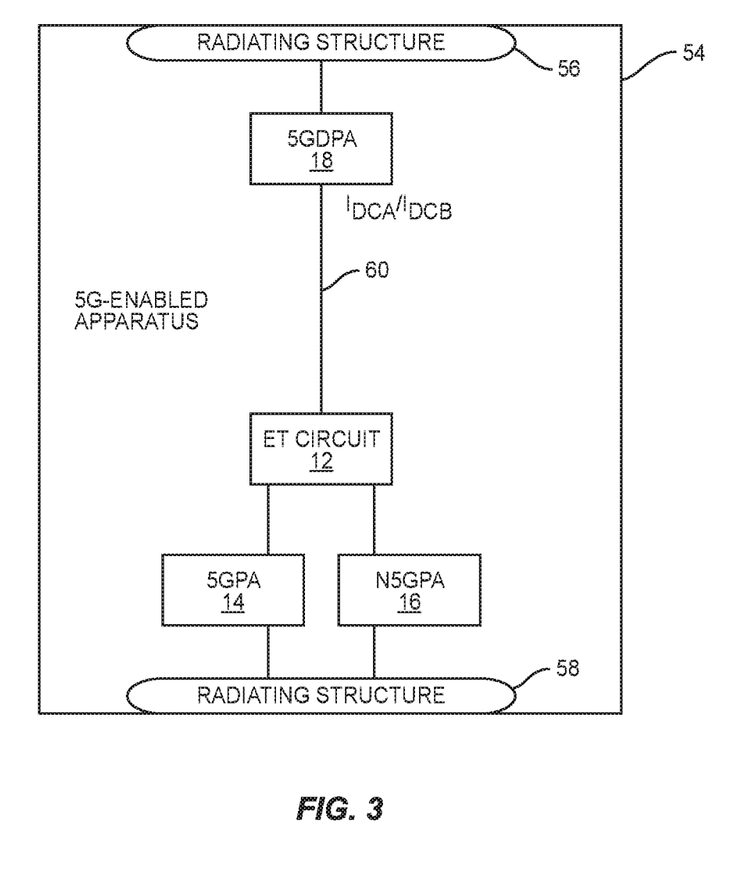
FIG. 3 is a schematic diagram of an exemplary 5G-enabled apparatus incorporating the ET amplifier apparatus of FIG. 1.

The ET amplifier apparatus 10 of FIG. 1 can be provided in a 5G enabled apparatus (e.g., a 5G-enabled smartphone) to enable ET function in the SA and the NSA modes. In this regard, FIG. 3 is a schematic diagram of an exemplary 5G-enabled apparatus 54 incorporating the ET amplifier apparatus of FIG. 1. Common elements between FIGS. 1 and 3 are shown therein with common element numbers and will not be re-described herein.

The 5G-enabled apparatus 54 includes a first radiating structure 56 (e.g., a first antenna) and a second radiating structure 58 (e.g., a second antenna). The first radiating structure 56 may be provided on one edge (e.g., top edge) of the 5G-enabled apparatus 54 and the second radiating structure 58 may be provided on an opposing edge (e.g., bottom edge) of the 5G-enabled apparatus 54.

In a non-limiting example, the DPA circuit 18 may be provided closer to the first radiating structure 56 than to the second radiating structure 58. In contrast, the ET circuit 12, the first power amplifier circuit 14, and the second power amplifier circuit 16 may be provided closer to the second radiating structure 58 than to the first radiating structure 56.

The DPA circuit 18 may be coupled to the ET circuit 12 via a conductive trace 60. As discussed earlier, the ET circuit is only configured to provide either the first DC $I_{DCA}$ or the second DC $I_{DCB}$ to the DPA circuit 18. As such, an inherent trace inductance associated with the conductive trace 60 may have very little impact on the DPA circuit 18.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) circuit comprising:
at least one first port coupled to at least one first power amplifier circuit configured to amplify a fifth-generation (5G) signal for transmission in at least one 5G band;
at least one second port coupled to at least one second power amplifier circuit configured to amplify an anchor signal for transmission in at least one anchor band;
at least one third port coupled to at least one distributed power amplifier (DPA) circuit configured to amplify the 5G signal for transmission in the at least one 5G band; and
a control circuit configured to:
cause an ET voltage to be provided to a selected port among the at least one first port and the at least one second port for amplifying a selected signal among the 5G signal and the anchor signal; and
cause a non-ET current to be provided to the at least one third port for amplifying the 5G signal.

2. The ET circuit of claim 1 configured to operate in a non-standalone (NSA) mode and a standalone (SA) mode.

3. The ET circuit of claim 2 further comprising:
a first tracker circuit comprising:
a first charge pump circuit configured to generate a first non-ET current; and
a first voltage amplifier configured to generate a first ET voltage and a first ET current; and
a second tracker circuit comprising:
a second charge pump circuit configured to generate a second non-ET current; and
a second voltage amplifier configured to generate a second ET voltage and a second ET current.

4. The ET circuit of claim 3 wherein the control circuit is further configured to:
couple the first voltage amplifier to the selected port to provide the first ET voltage as the ET voltage for amplifying the selected signal in the SA mode and the NSA mode; and
couple the second charge pump circuit to the at least one third port to provide the second non-ET current as the non-ET current for amplifying the 5G signal in the SA mode and the NSA mode.

5. The ET circuit of claim 4 wherein the first voltage amplifier and the first charge pump circuit are configured to provide the first ET current and the first non-ET current to the selected port in the SA mode and the NSA mode.

6. The ET circuit of claim 3 wherein the control circuit is further configured to:
couple the second voltage amplifier to the selected port to provide the second ET voltage as the ET voltage for amplifying the selected signal in the SA mode and the NSA mode; and
couple the first charge pump circuit to the at least one third port to provide the first non-ET current as the non-ET current for amplifying the 5G signal in the SA mode and the NSA mode.

7. The ET circuit of claim 6 wherein the second voltage amplifier and the second charge pump circuit are configured to provide the second ET current and the second non-ET current to the selected port in the SA mode and the NSA mode.

8. The ET circuit of claim 3 wherein, in the SA mode, the control circuit is further configured to:
couple the first voltage amplifier to the at least one first port to provide the first ET voltage as the ET voltage to the at least one first power amplifier circuit for amplifying the 5G signal; and
couple the second charge pump circuit to the at least one third port to provide the second non-ET current as the non-ET current to the at least one DPA circuit for amplifying the 5G signal.

9. The ET circuit of claim 8 wherein the control circuit is further configured to deactivate the second voltage amplifier and decouple the second charge pump circuit from the at least one second port.

10. The ET circuit of claim 8 wherein:
the control circuit is further configured to couple the first charge pump circuit to the at least one first port to provide the first non-ET current to the at least one first port; and
the first voltage amplifier is further configured to provide the first ET current to the at least one first port.

11. The ET circuit of claim 3 wherein, in the SA mode, the control circuit is further configured to:
- couple the second voltage amplifier to the at least one first port to provide the second ET voltage as the ET voltage to the at least one first power amplifier circuit for amplifying the 5G signal; and
- couple the first charge pump circuit to the at least one third port to provide the first non-ET current as the non-ET current to the at least one DPA circuit for amplifying the 5G signal.

12. The ET circuit of claim 11 wherein the control circuit is further configured to deactivate the first voltage amplifier and decouple the first charge pump circuit from the at least one second port.

13. The ET circuit of claim 11 wherein:
- the control circuit is further configured to couple the second charge pump circuit to the at least one first port to provide the second non-ET current to the at least one first port; and
- the second voltage amplifier is further configured to provide the second ET current to the at least one first port.

14. The ET circuit of claim 3 wherein, in the NSA mode, the control circuit is further configured to:
- couple the first voltage amplifier to the at least one second port to provide the first ET voltage as the ET voltage to the at least one second power amplifier circuit for amplifying the anchor signal; and
- couple the second charge pump circuit to the at least one third port to provide the second non-ET current as the non-ET current to the at least one DPA circuit for amplifying the 5G signal.

15. The ET circuit of claim 14 wherein the control circuit is further configured to deactivate the second voltage amplifier and decouple the second charge pump circuit from the at least one first port.

16. The ET circuit of claim 14 wherein:
- the control circuit is further configured to couple the first charge pump circuit to the at least one second port to provide the first non-ET current to the at least one second port; and
- the first voltage amplifier is further configured to provide the first ET current to the at least one second port.

17. The ET circuit of claim 3 wherein, in the NSA mode, the control circuit is further configured to:
- couple the second voltage amplifier to the at least one second port to provide the first ET voltage as the ET voltage to the at least one second power amplifier circuit for amplifying the anchor signal; and
- couple the first charge pump circuit to the at least one third port to provide the second non-ET current as the non-ET current to the at least one DPA circuit for amplifying the 5G signal.

18. The ET circuit of claim 17 wherein the control circuit is further configured to deactivate the first voltage amplifier and decouple the first charge pump circuit from the at least one first port.

19. The ET circuit of claim 17 wherein:
- the control circuit is further configured to couple the second charge pump circuit to the at least one second port to provide the second non-ET current to the at least one second port; and
- the second voltage amplifier is further configured to provide the second ET current to the at least one second port.

20. The ET circuit of claim 2 wherein the at least one DPA circuit comprises:
- a distributed voltage amplifier configured to generate a distributed ET voltage and a distributed ET current; and
- a distributed power amplifier circuit configured to amplify the 5G signal based on the non-ET current, the distributed ET voltage, and the distributed ET current in the NSA mode and the SA mode.

* * * * *